(12) United States Patent
Gyotoku et al.

(10) Patent No.: US 11,754,632 B2
(45) Date of Patent: Sep. 12, 2023

(54) VOLTAGE MONITORING MODULE

(71) Applicant: NIPPON MEKTRON, LTD., Tokyo (JP)

(72) Inventors: Hajime Gyotoku, Tokyo (JP); Kazuki Ikemiya, Tokyo (JP); Shuzo Yamada, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 49 days.

(21) Appl. No.: 17/544,903

(22) Filed: Dec. 7, 2021

(65) Prior Publication Data

US 2022/0236332 A1 Jul. 28, 2022

(30) Foreign Application Priority Data

Jan. 27, 2021 (JP) ................. 2021-010869

(51) Int. Cl.
*G01R 31/3835* (2019.01)
*H05K 1/02* (2006.01)

(52) U.S. Cl.
CPC ....... *G01R 31/3835* (2019.01); *H05K 1/0277* (2013.01); *H05K 2201/1034* (2013.01); *H05K 2201/10272* (2013.01)

(58) Field of Classification Search
CPC ............. G01R 31/3835; H05K 1/0277; H05K 2201/10272; H05K 2201/1034; H05K 2201/053; H05K 2201/10037; H05K 2201/10962; H05K 1/189; H01M 50/569; H01M 10/482; H01M 50/507; H01M 50/516
See application file for complete search history.

(56) References Cited

U.S. PATENT DOCUMENTS

| 2002/0038723 | A1 | 4/2002 | Takeda | |
| 2013/0000957 | A1* | 1/2013 | Ikeda | H01M 50/505 174/254 |
| 2015/0271922 | A1* | 9/2015 | Kawabata | H05K 3/3447 361/748 |
| 2022/0346219 | A1* | 10/2022 | Hasegawa | H05K 1/028 |
| 2023/0031168 | A1* | 2/2023 | Yoshida | H05K 1/184 |

FOREIGN PATENT DOCUMENTS

JP  2002-111170 A  4/2002

\* cited by examiner

*Primary Examiner* — Jermele M Hollington
*Assistant Examiner* — Zannatul Ferdous
(74) *Attorney, Agent, or Firm* — Studebaker & Brackett PC

(57) ABSTRACT

Provided is a voltage monitoring module which includes: a land; and a metal plate arranged on the land and soldered to the land, in which a through-hole is partially formed at a location of the metal plate corresponding to the land, a non-formation area is formed at a location of the land corresponding to part of the through-hole, and no conductor is formed in the non-formation area.

9 Claims, 14 Drawing Sheets

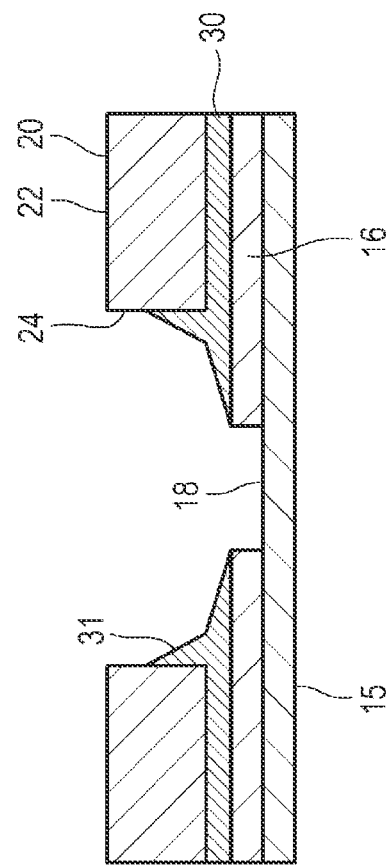
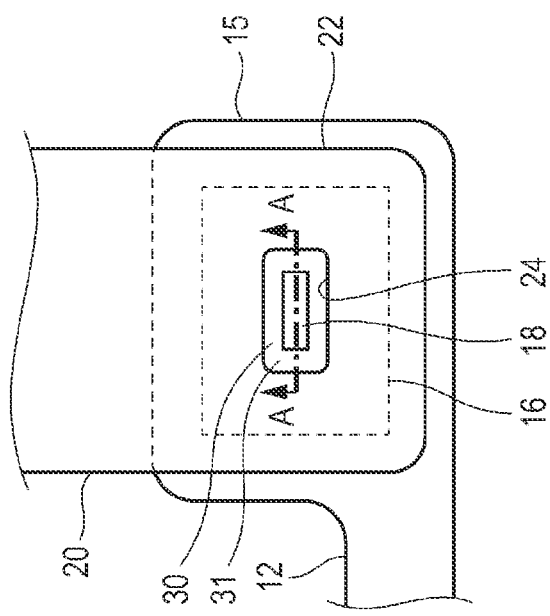
FIG. 4B
FIG. 4A

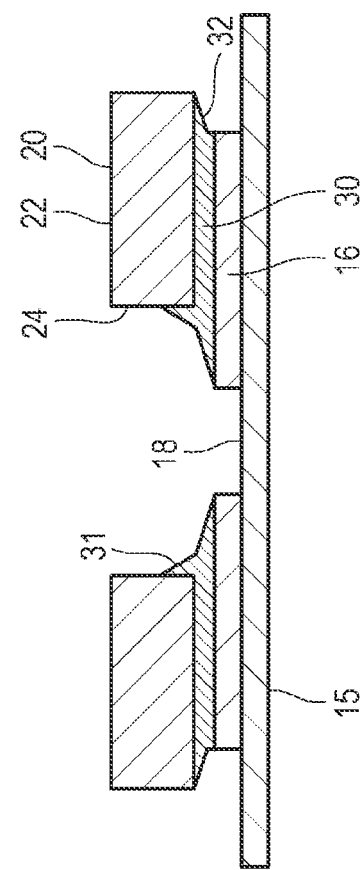
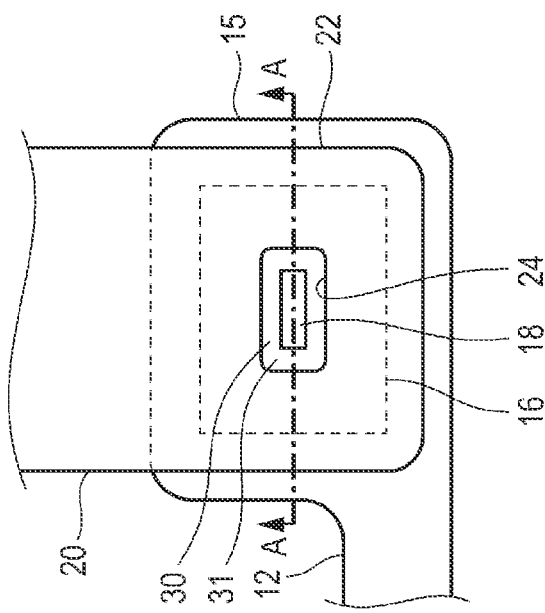

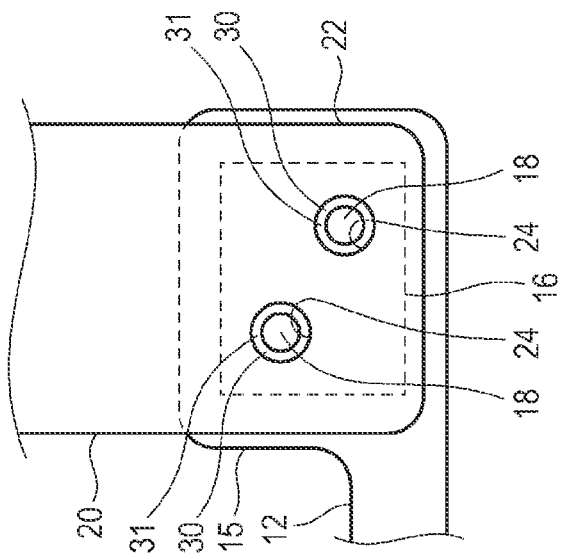
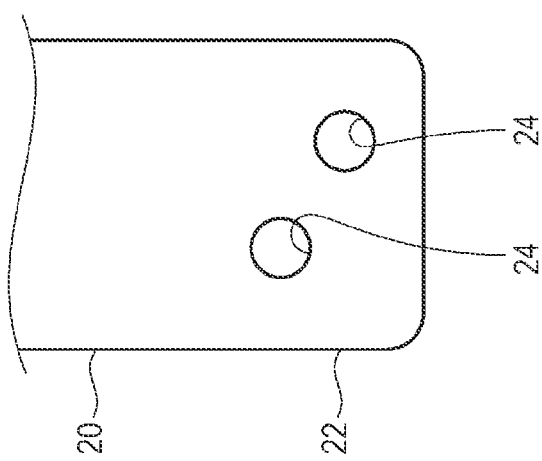
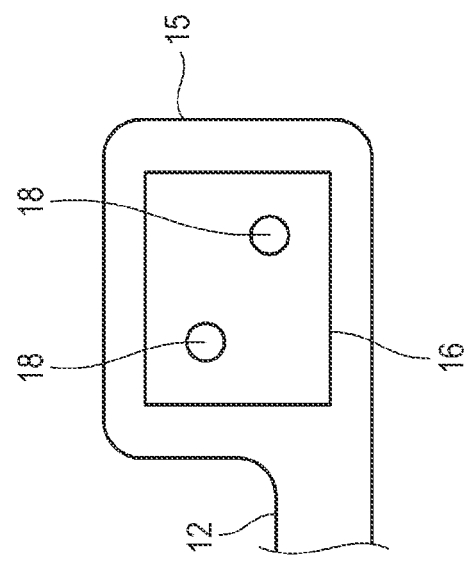

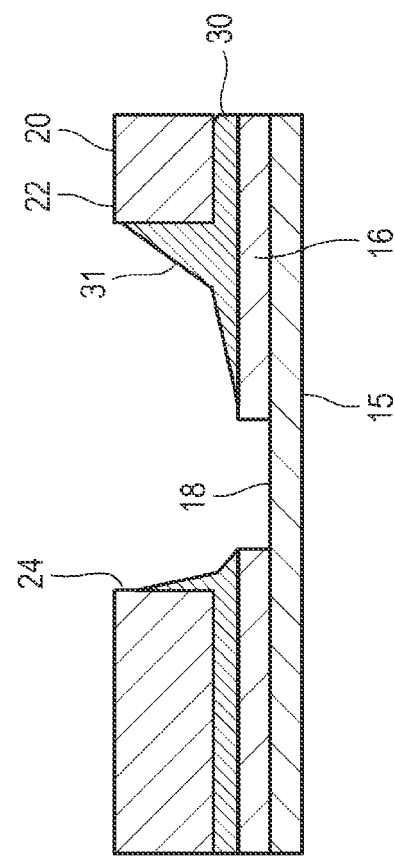
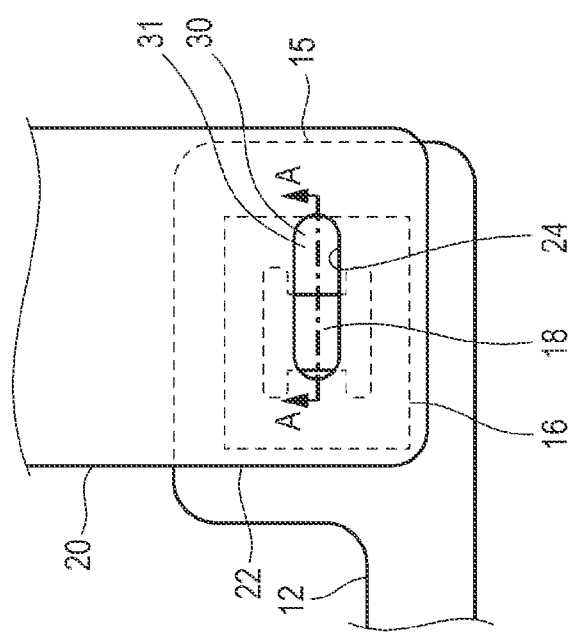
FIG. 10A
FIG. 10B

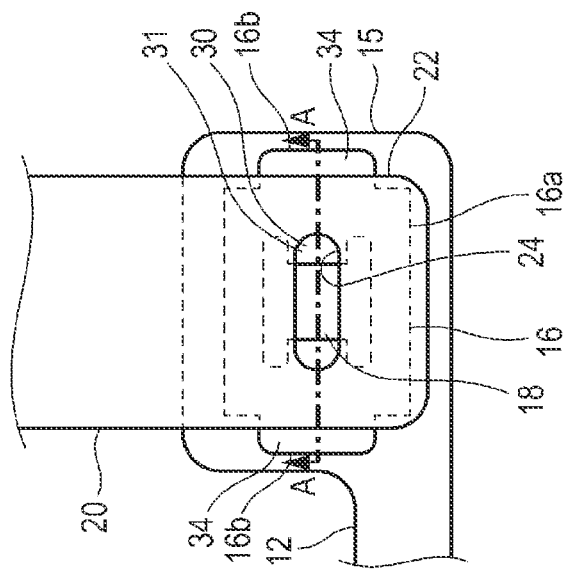
FIG. 12A
FIG. 12B
FIG. 12C
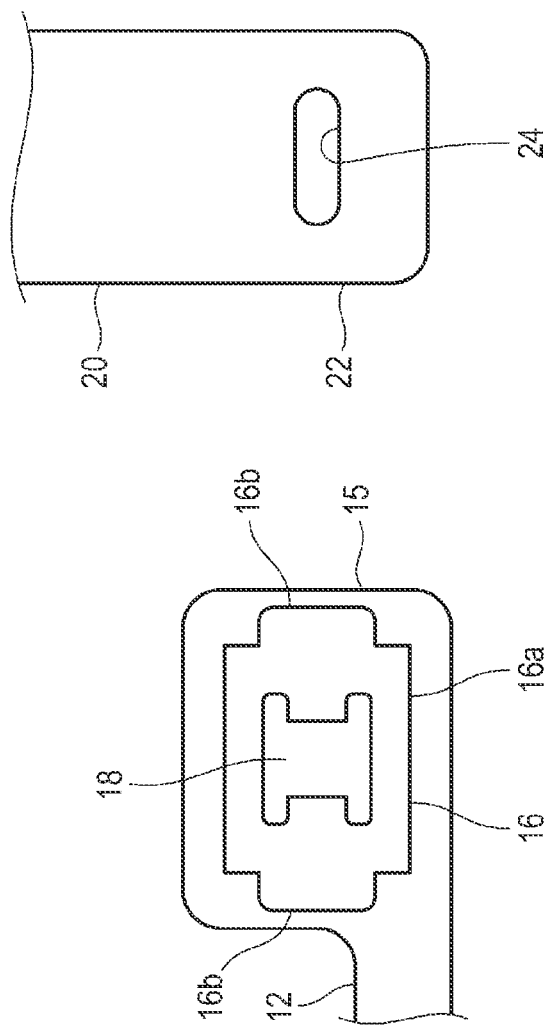
FIG. 12D
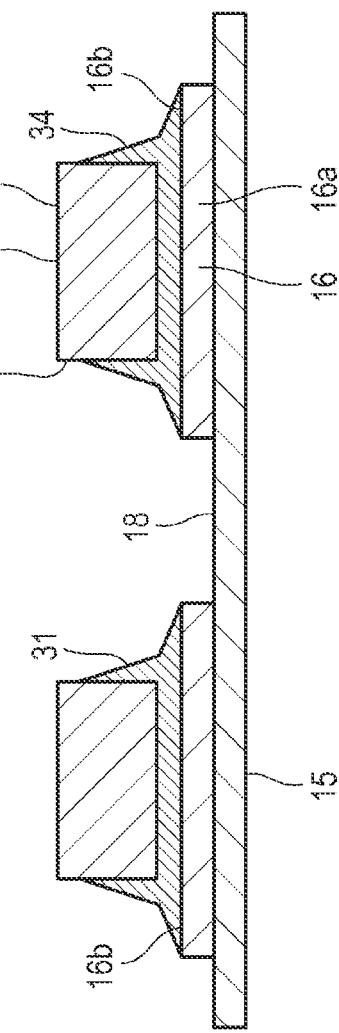

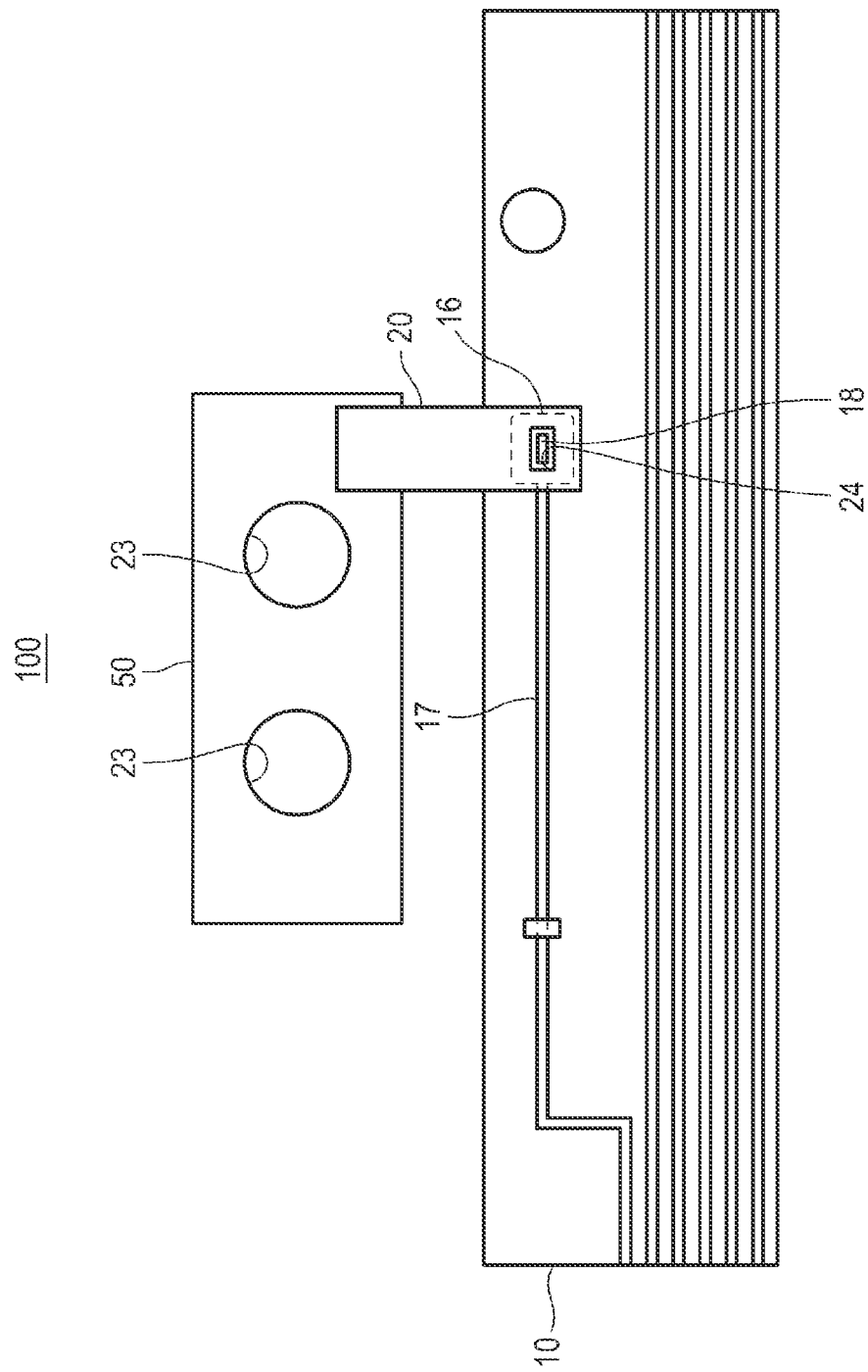

US 11,754,632 B2

1

VOLTAGE MONITORING MODULE

CROSS-REFERENCE TO RELATED APPLICATION

This application claims priority from Japanese Patent Application No. 2021-010869 filed with the Japan Patent Office on Jan. 27, 2021, the entire content of which is hereby incorporated by reference.

BACKGROUND

1. Technical Field

The present disclosure relates to a voltage monitoring module.

2. Related Art

JP-A-2002-111170 describes a printed circuit board having a cutout formation portion formed at a metal plate soldered to a land.

SUMMARY

A voltage monitoring module according to the present embodiment includes: a land; and a metal plate arranged on the land and soldered to the land, in which a through-hole is partially formed at a location of the metal plate corresponding to the land, a non-formation area is formed at a location of the land corresponding to part of the through-hole, and no conductor is formed in the non-formation area.

BRIEF DESCRIPTION OF THE DRAWINGS

FIG. 4A is a partially-enlarged plan view of the voltage monitoring module according to the first embodiment;

FIG. 4B is a cut end view along an A-A line of FIG. 4A:

FIG. 5A is a partially-enlarged plan view of the voltage monitoring module according to the first embodiment:

FIG. 5B is a cut end view along an A-A line of FIG. 5A;

FIG. 7A is a plan view of an end portion of an extending portion of a flexible printed circuit board included in the voltage monitoring module according to the second embodiment:

FIG. 7B is a plan view of a metal plate of the voltage monitoring module according to the second embodiment:

FIG. 7C is a partially-enlarged plan view of the voltage monitoring module according to the second embodiment:

FIG. 10A is a partially-enlarged plan view of the voltage monitoring module according to the third embodiment:

FIG. 10B is a cut end view along an A-A line of FIG. 10A:

FIG. 12A is a plan view of an end portion of an extending portion of a flexible printed circuit board included in the voltage monitoring module according to the fourth embodiment:

FIG. 12B is a plan view of a metal plate of the voltage monitoring module according to the fourth embodiment:

FIG. 12C is a partially-enlarged plan view of the voltage monitoring module according to the fourth embodiment:

FIG. 12D is a cut end view along an A-A line of FIG. 12C:

FIG. 13 is a plan view of a voltage monitoring module according to a fifth embodiment.

DETAILED DESCRIPTION

Figure 1:
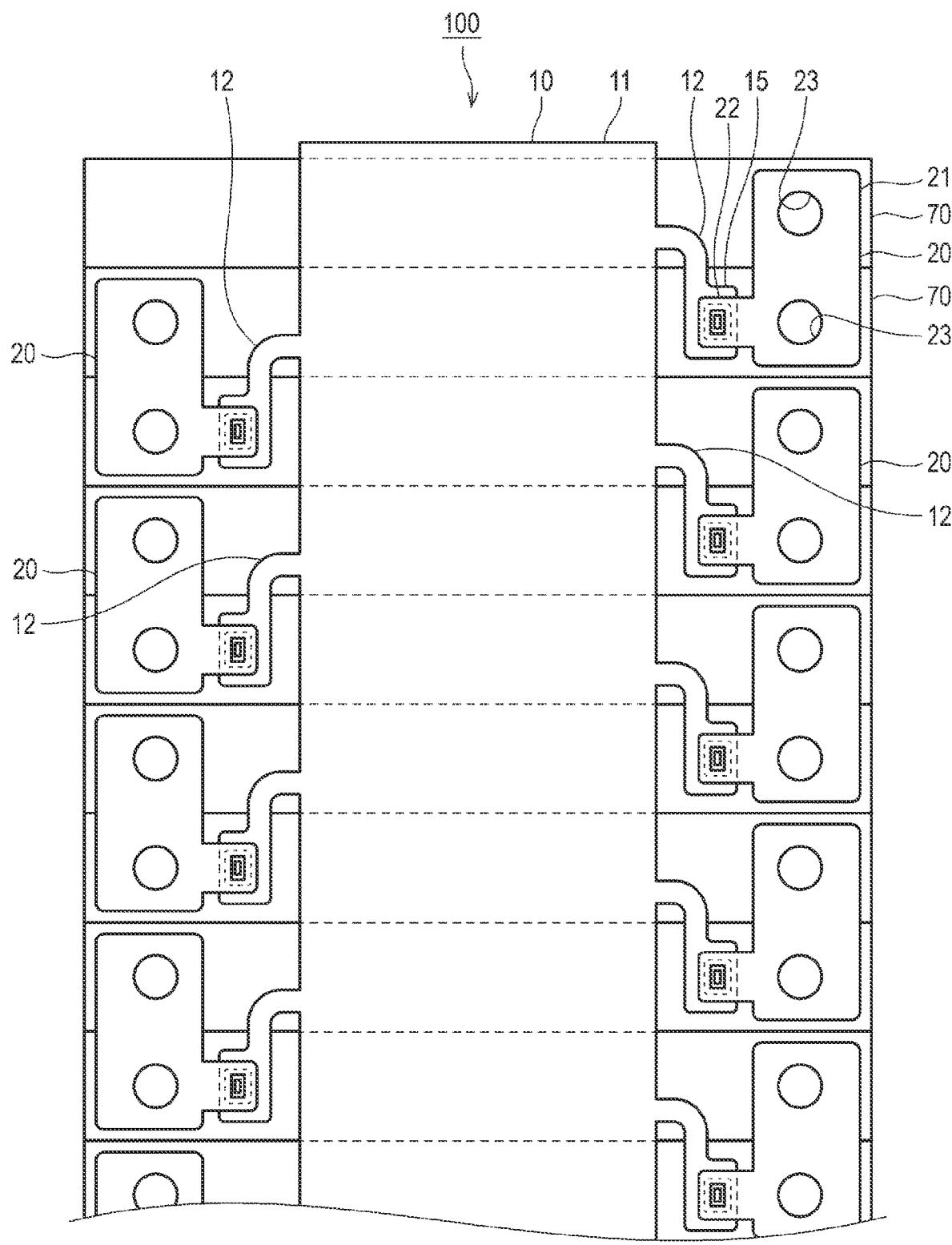
FIG. 1 is a plan view showing a voltage monitoring module according to the present embodiments and multiple battery cells connected to the voltage monitoring module.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The technique disclosed in JP-A-2002-111170 has room for improvement in terms of the accuracy of the position of the metal plate with respect to the land.

The present embodiments cope with the above-described problem. According to the present embodiments, a voltage monitoring module capable of achieving the favorable accuracy of the position of the metal plate with respect to the land is provided.

According to the present disclosure, provided is a voltage monitoring module which includes: a land; and a metal plate arranged on the land and soldered to the land, in which a through-hole is partially formed at a location of the metal plate corresponding to the land, a non-formation area is formed at a location of the land corresponding to part of the through-hole, and no conductor is formed in the non-formation area.

According to the present embodiments, the favorable accuracy of the position of the metal plate with respect to the land can be achieved.

Hereinafter, the present embodiments will be described with reference to the drawings. Note that in all drawings, the same reference numerals are used to represent similar components and description thereof will be omitted as necessary.

First Embodiment

First, a first embodiment will be described with reference to FIGS. 1 to 5B.

Figure 3:
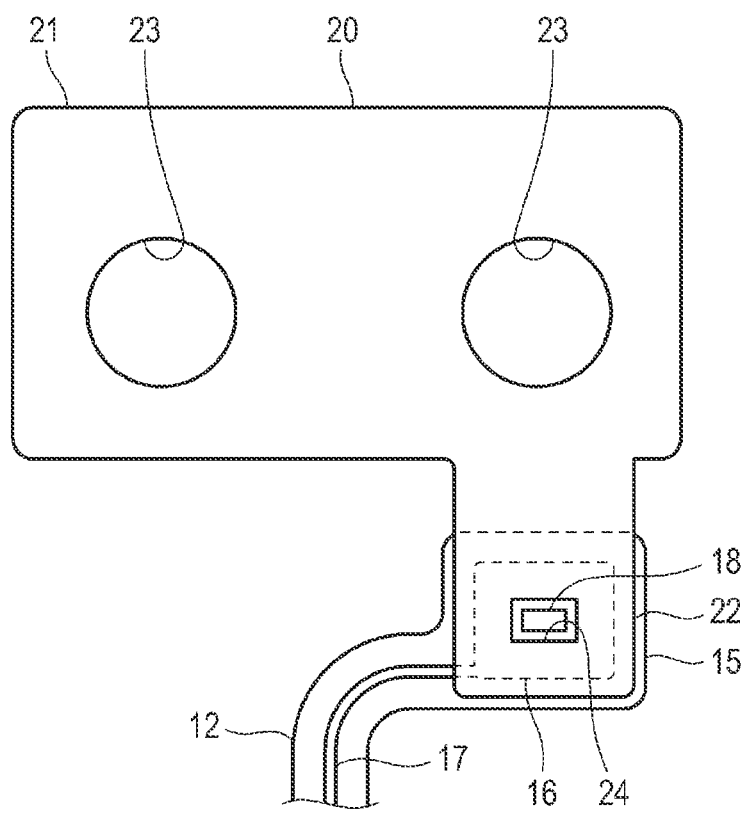
FIG. 3 is a partially-enlarged plan view of a voltage monitoring module according to a first embodiment.

Note that in FIG. 1, a fixing member for fixing a metal plate 20 to a battery cell 70 is not shown. FIG. 3 shows, in closeup, an area including one metal plate 20 and an end portion 15 of one extending portion 12 corresponding to the metal plate 20. FIGS. 4A and 5A show an area including the end portion 15 in closeup. FIGS. 4A and 5A do not show a wiring 17.

A voltage monitoring module 100 according to the present embodiment includes a flexible printed circuit board 10 (FIGS. 1 and 2) and the multiple metal plates 20. The flexible printed circuit board 10 has the multiple wirings 17 (FIG. 3) and multiple lands 16 (FIGS. 3 to 5B). One end of each wiring 17 is connected to the land 16. The multiple metal plates 20 are each arranged on the lands 16, and are each soldered to the lands 16.

A through-hole 24 (FIGS. 3 to 5B) is partially formed at a location of the metal plate 20 corresponding to the land 16.

A non-formation area 18 (FIGS. 3 to 5B) is formed at a location of the land 16 corresponding to part of the through-hole 24. No conductor is formed in the non-formation area 18.

In the present embodiment, the metal plate 20 may be a bus bar. Alternatively, the metal plate 20 may be a metal tab connected to a bus bar. In the present embodiment, an example where the metal plate 20 is the bus bar will be described.

According to the present embodiment, the through-hole 24 is partially formed at the location of the metal plate 20 corresponding to the land 16. Thus, voids contained in molten solder 30 can be removed through the through-hole 24. As a result, the voids remaining in the solder 30 can be reduced.

In addition, the non-formation area 18 is formed at the location of the land 16 corresponding to part of the through-hole 24 of the metal plate 20. Further, no conductor is formed in the non-formation area 18. With this configuration, when the metal plate 20 is soldered to the land 16, the accuracy of the position of the metal plate 20 with respect to the land 16 is naturally favorably controlled by surface tension of the molten solder. Thus, it can be expected that the necessity of using a tool configured to hold the metal plate 20 for holding the position accuracy of the metal plate 20 is eliminated.

The non-formation area 18 is arranged at the position corresponding to the through-hole 24. Thus, a fillet 31 (FIGS. 4A and 4B) of the solder 30 can be formed in an inner region of the through-hole 24. Consequently, even if the land 16 has such dimensions that the land 16 is covered with the metal plate 20, the exterior appearance of the fillet 31 can be easily inspected by image inspection equipment. Note that the exterior appearance inspection of the fillet 31 may be, other than inspection by the image inspection equipment, visual inspection by an inspector or inspection using an X-ray inspection machine.

The non-formation area 18 is arranged at the position corresponding to the through-hole 24. Thus, a flux used for soldering can flow into the non-formation area 18. This can suppress the flux from thickly accumulating in the through-hole 24. Consequently, favorable visibility of the fillet 31 (FIG. 4B) of the solder 30 is provided. Moreover, the exterior appearance inspection of the fillet 31 can be easily reliably performed. As a result, the reliability of such exterior appearance inspection can be improved.

The fillet 31 can be formed along the inner periphery of the through-hole 24. Thus, a sufficient total extension of the fillet 31 can be ensured. As a result, a sufficient bonding strength between the land 16 and the metal plate 20 can be ensured.

Hereinafter, the present embodiment will be described in more detail.

Figure 2:
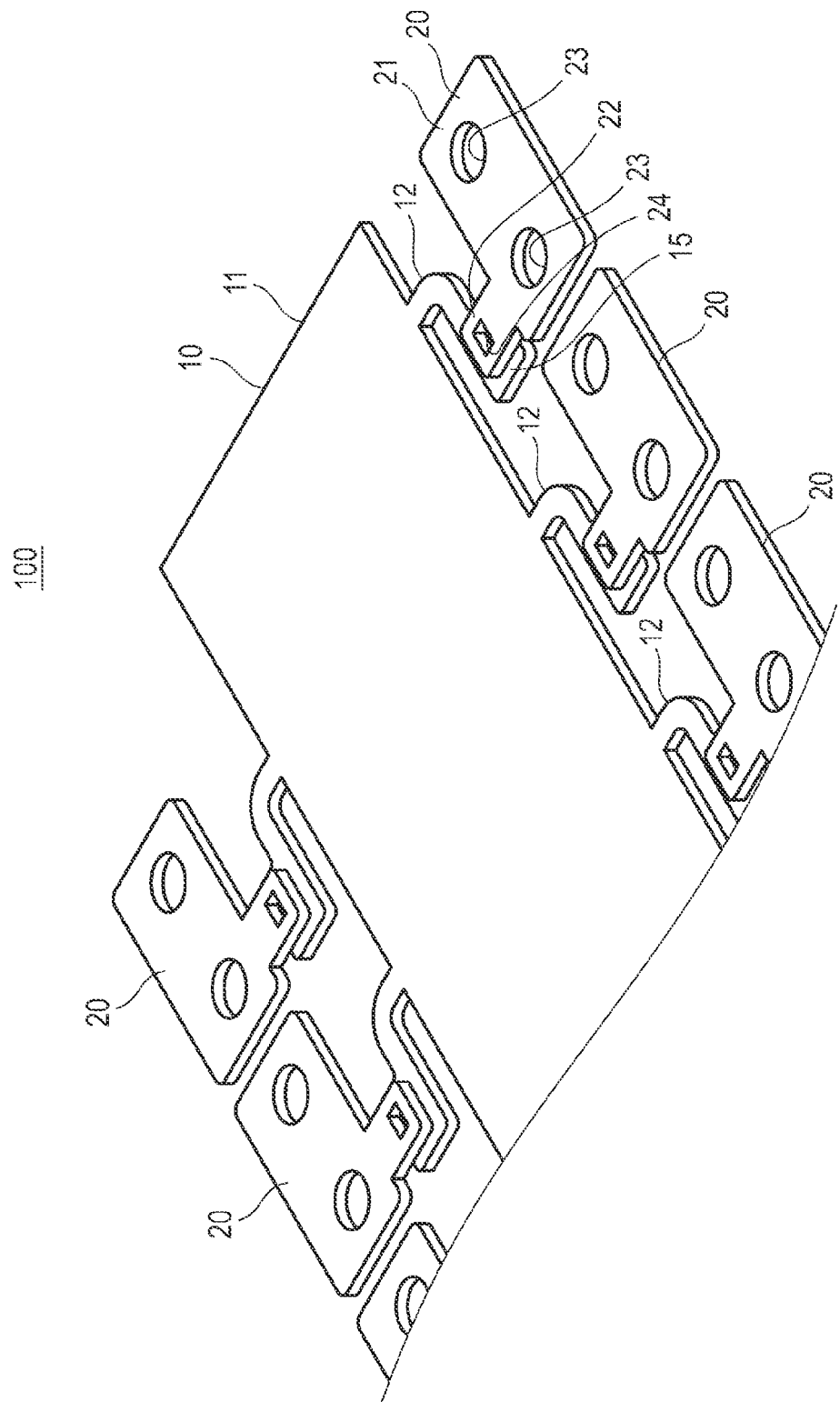
FIG. 2 is a perspective view of the voltage monitoring module according to the present embodiments.

As shown in FIGS. 1 and 2, the flexible printed circuit board 10 includes a flat plate-shaped body portion 11 and the multiple extending portions 12 extending from an edge of the body portion 11.

The shape of the extending portion 12 is not specifically limited. In an example shown in FIG. 2, the extending portion 12 is formed in a bent shape, and has the end portion 15 at a tip end.

The end portion 15 is, for example, formed wider than a portion of the body portion 11 side of the extending portion 12. In the example of FIG. 2, the entirety of the extending portion 12 is arranged on the same plane. The planar shape of the end portion 15 is not specifically limited. In the example of FIG. 2, the planar shape is a rectangular shape having three rounded corner portions.

As shown in FIG. 3, a thin film of a conductor such as metal is formed as the land 16 on the end portion 15.

The planar shape of the land 16 is not specifically limited. In an example of FIG. 3, the planar shape is a rectangular shape having rounded corner portions.

The flexible printed circuit board 10 includes the multiple wirings 17. Each of the multiple wirings 17 extends from the body portion 11 to the end portion 15 of the extending portion 12. For example, the single wiring 17 is arranged on each extending portion 12. The single land 16 is formed on each end portion 15. A tip end of each wiring 17 is connected to a corresponding one of the lands 16.

As described above, the non-formation area 18 is formed at part of the land 16. No conductor is formed in the non-formation area 18. That is, adhesion of the solder 30 is reduced because no conductor is present in the non-formation area 18.

The non-formation area 18 is arranged in an island shape inside the outline of the land 16.

The planar shape of the non-formation area 18 is not specifically limited. In the case of the present embodiment, the planar shape is, for example, a rectangular shape elongated in one direction. Note that in the present embodiment, the planar shape of the non-formation area 18 may be other shapes including a circular shape and a polygonal shape other than the rectangular shape.

The number of non-formation areas 18 arranged at each land 16 is not specifically limited. In the case of the present embodiment, the single non-formation area 18 is arranged at each land 16.

The metal plate 20 is, for example, formed in a flat plate shape. The metal plate 20 has, for example, a body portion 21 and a protruding portion 22 having a smaller width dimension than that of the body portion 21 and protruding from the body portion 21. The planar shape of the body portion 21 is not specifically limited. In the example of FIG. 3, the planar shape is a rectangular shape having rounded corner portions. The planar shape of the protruding portion 22 is not specifically limited. In the example of FIG. 3, the planar shape is a rectangular shape having two rounded corner portion on a tip end side in a protruding direction.

The flexible printed circuit board 10 described herein connects the wirings 17 to bus bars connecting the multiple battery cells 70, thereby monitoring the voltages of the battery cells 70, for example. That is, in the case of the present embodiment, the metal plates 20 are the bus bars connecting the multiple battery cells 70 in series.

In the case of the present embodiment, the voltage monitoring module 100 includes the flexible printed circuit board 10 and the multiple metal plates 20. These metal plates 20 connect the multiple battery cells 70 in series.

The battery cell 70 is, for example, a secondary battery.

For example, a connector is attached to the flexible printed circuit board 10. The flexible printed circuit board 10 can be, via the connector, connected to measurement equipment configured to perform various types of control. In this manner, the voltage can be monitored.

In an example of FIG. 1, the body portion 21 of the metal plate 20 has two fixing holes 23. With the fixing holes 23, adjacent two of the battery cells 70 are fixed and electrically connected to the body portion 21. Note that in a case where the metal plate 20 is the metal tab connected to the bus bar, the bus bar may have the fixing holes 23 instead of the metal plate 20.

The through-hole 24 is formed at the protruding portion 22. The through-holes 24 penetrates (the protruding portion 22 of) the metal plate 20 in a thickness direction thereof.

The number of through-holes 24 formed at each metal plate 20 is not specifically limited. In the case of the present embodiment, the single through-hole 24 is formed at (the protruding portion 22 of) each metal plate 20.

The planar shape of the through-hole 24 is not specifically limited. In the example of the present embodiment, the planar shape is a rectangular shape elongated in one direction. Note that in the present disclosure, the shape of the through-hole 24 may be other shapes including a circular shape and a polygonal shape other than the rectangular shape.

In the case of the present embodiment, the through-hole 24 has a larger area than that of the non-formation area 18.

As shown in FIGS. 4A to 5B, the protruding portion 22 of each metal plate 20 is bonded to the land 16 of a corresponding one of the extending portions 12 via the solder 30.

In the case of the present embodiment, the land 16 has a smaller area than that of the protruding portion 22. As shown in FIGS. 3 and 4A, when viewed in the thickness direction of the metal plate 20, the land 16 is within the outline of the metal plate 20. More specifically, the land 16 is within the outline of the protruding portion 22 of the metal plate 20. Thus, size reduction in the land 16 and therefore the end portion 15 of the extending portions 12 can be achieved. Further, not only space limitations but also layout limitations on each portion of the flexible printed circuit board 10 are loosened.

Further, in the case of the present embodiment, when viewed in the thickness direction of the metal plate 20, the non-formation area 18 is within the through-hole 24. Thus, when the solder 30 is viewed from the back side, the fillet 31 is formed along the entire inner periphery of the through-hole 24. Thus, the fillet 31 is more easily checked.

For example, as shown in, e.g., FIG. 4A, a longitudinal direction of the through-hole 24 and a longitudinal direction of the non-formation area 18 are coincident with each other. In addition, the non-formation area 18 is arranged at a center portion of the through-hole 24.

In the case of the present embodiment, each of the through-hole 24 and the non-formation area 18 is in the rectangular shape. Thus, a condition where at least one of the through-hole 24 or the non-formation area 18 is in a non-circular shape is satisfied. With this configuration, the accuracy of the position of the metal plate 20 with respect to the land 16 is naturally favorably controlled by the surface tension of the molten solder as described above. According to the present embodiment, such a control effect can be more reliably obtained.

As shown as an example in FIG. 5B, a fillet 32 is formed along the outer periphery of the land 16 on a surface of the protruding portion 22 facing an end portion 15 side. The fillet 32 has a shape inverted from that of the fillet 31.

Depending on the amount of solder 30, the fillet 32 is not necessarily formed across the entire outer periphery of the land 16. In this case, the fillet 32 may be selectively formed along part of the outer periphery of the land 16. Alternatively, substantially no fillet 32 may be formed.

Figure 14:
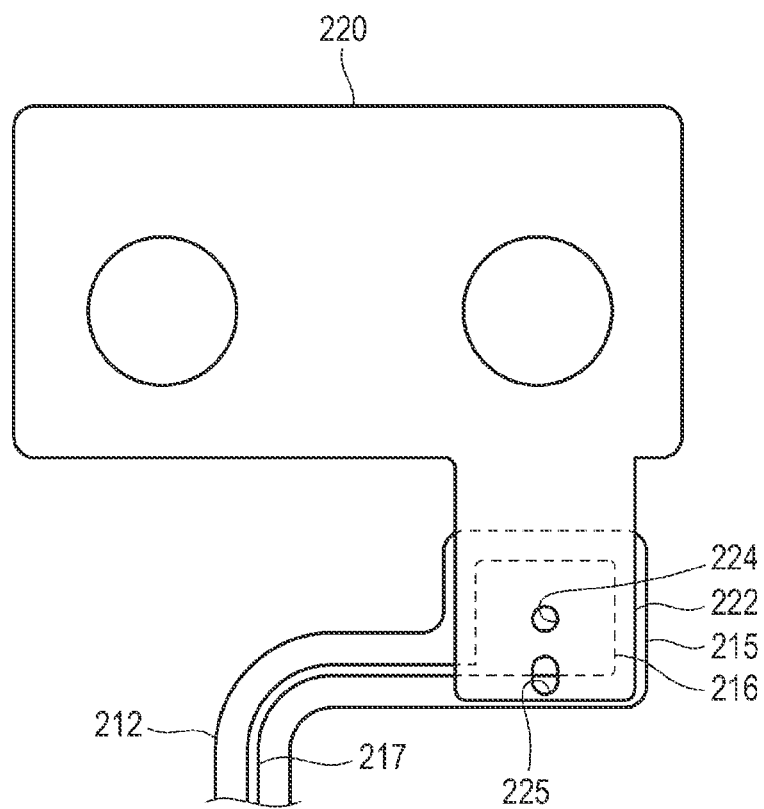
FIG. 14 is a partially-enlarged plan view of a voltage monitoring module according to a reference embodiment.

FIG. 14 is a partially-enlarged plan view of a voltage monitoring module according to a reference embodiment.

The voltage monitoring module according to the reference embodiment includes, for example, a flexible printed circuit board having extending portions 212 and metal plates 220. This flexible printed circuit board has wirings 217. A tip end of each wiring 217 is connected to a land 216. The land 216 is arranged on an end portion 215 of the extending portion 212.

For example, two through-holes (a through-hole 224 and a through-hole 225) are formed at a protruding portion 222 of the metal plate 220. Of these through-holes, the through-hole 224 entirely overlaps with the land 216. On the other hand, part of the through-hole 225 overlaps with the land 216, but the remaining part of the through-hole 225 does not overlap with the land 216.

No non-formation area 18 is present on the land 216 of the voltage monitoring module according to the reference embodiment.

On the other hand, the voltage monitoring module 100 according to the present embodiment is configured such that the non-formation area 18 is formed on the land 16. Thus, according to the present embodiment, the better effect of reducing position shift between the land 16 and the metal plate 20 is provided as compared to the voltage monitoring module according to the reference embodiment.

Second Embodiment

Next, a second embodiment will be described with reference to FIGS. 6 to 7C.

Figure 6:
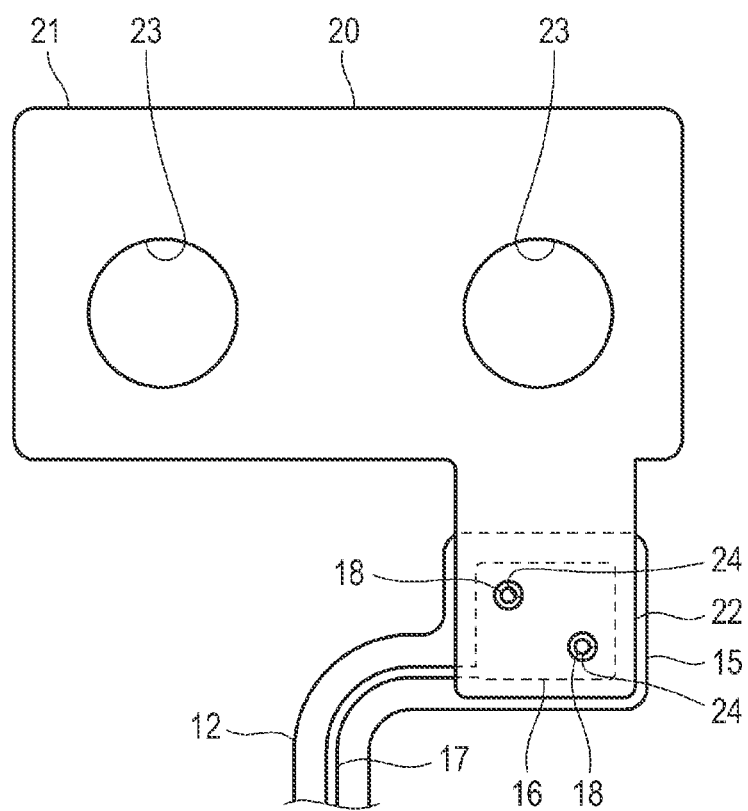
FIG. 6 is a partially-enlarged plan view of a voltage monitoring module according to a second embodiment.

Note that FIG. 6 shows, in closeup, an area including a single metal plate 20 and an end portion 15 of a single extending portion 12 corresponding to the metal plate 20. FIG. 7A shows an area including the single end portion 15 in closeup. FIG. 7B shows an area including a single protruding portion 22 in closeup. FIGS. 7A and 7C do not show a wiring 17.

A voltage monitoring module 100 according to the present embodiment is different from the voltage monitoring module 100 according to the first embodiment on the following points. On other points, the voltage monitoring module 100 according to the present embodiment has a configuration similar to that of the voltage monitoring module 100 according to the first embodiment.

As shown in any of FIGS. 6 to 7C, in the case of the present embodiment, multiple through-holes 24 are formed at the protruding portion 22 of each metal plate 20. On a land 16 of the end portion 15 of each extending portion 12, multiple non-formation areas 18 corresponding to the multiple through-holes 24 of the metal plate 20 in one-to-one correspondence are arranged.

That is, the multiple through-holes 24 are formed at the single metal plate 20. Moreover, the multiple non-formation areas 18 are present on the single land 16.

This can more reliably suppress the metal plate 20 from rotating (rotating in an in-plane direction of the metal plate 20) relative to the land 16 when the metal plate 20 is soldered to the land 16. Thus, the more favorable accuracy of the position of the metal plate 20 with respect to the land 16 can be achieved.

In the present embodiment, both of the shape of the through-hole 24 and the shape of the non-formation area 18 are not specifically limited. In the example of the present embodiment, any of these shapes is a circular shape. Each through-hole 24 has a larger diameter than that of a corresponding one of the non-formation areas 18. When viewed in a thickness direction of the metal plate 20, each non-formation area 18 is within a corresponding one of the through-holes 24.

The number of through-holes 24 at each metal plate 20 and the number of non-formation areas 18 on each land 16 may be two or three or more. In the example of the present embodiment, these numbers are two.

Arrangement of the multiple through-holes 24 is not specifically limited. In the example of the present embodiment, the multiple through-holes 24 are arranged at positions different from each other in a protruding direction (a down direction in FIGS. 7B and 7C) of the protruding portion 22.

Similarly, arrangement of the multiple non-formation areas 18 is not specifically limited. In the example of the present embodiment, the multiple non-formation areas 18 are arranged at positions different from each other in the protruding direction (the down direction in FIG. 7C) of the protruding portion 22. In other words, the multiple non-formation areas 18 are arranged at positions different from each other in a width direction (an up-down direction in FIGS. 7A and 7C) of the end portion 15.

Third Embodiment

Next, a third embodiment will be described with reference to FIGS. 8 to 10B.

Figure 8:
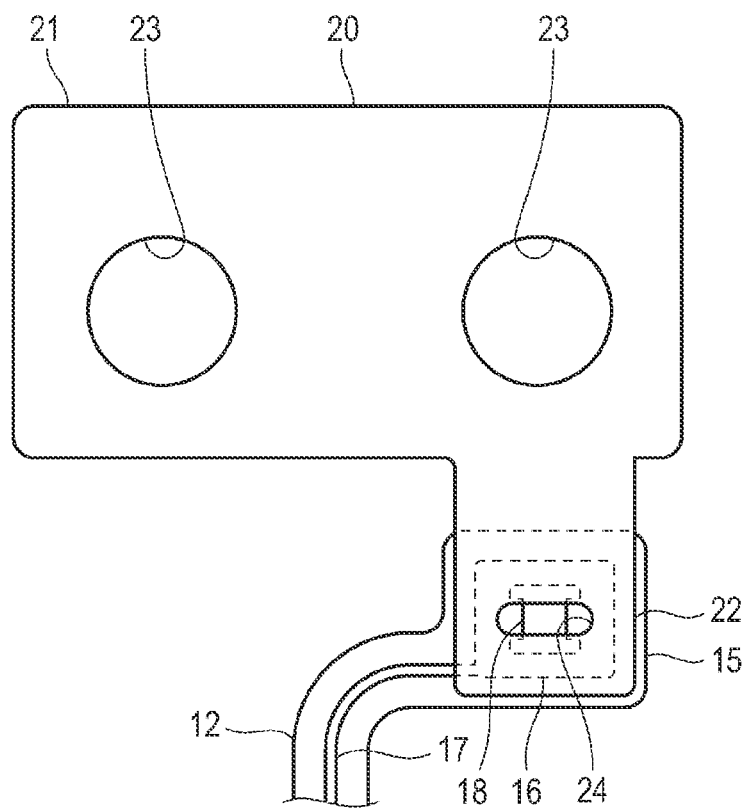
FIG. 8 is a partially-enlarged plan view of a voltage monitoring module according to a third embodiment.
Figure 9A:
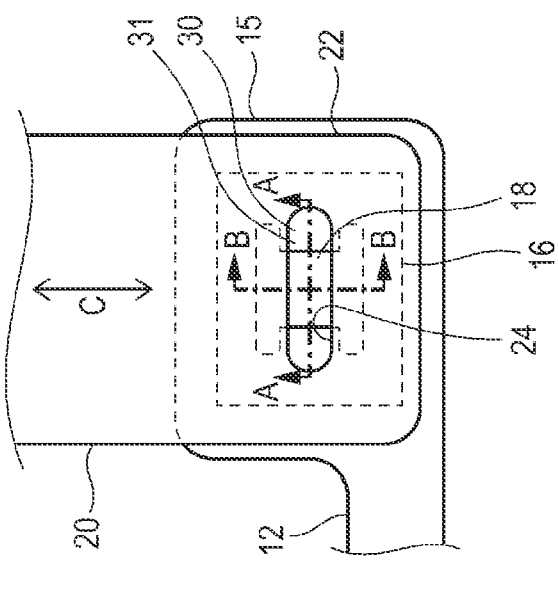
FIG. 9A is a plan view of an end portion of an extending portion of a flexible printed circuit board included in the voltage monitoring module according to the third embodiment.
Figure 9B:
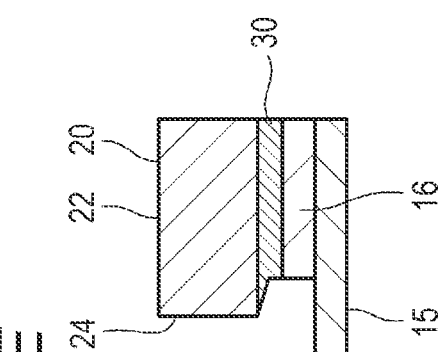
FIG. 9B is a plan view of a metal plate of the voltage monitoring module according to the third embodiment.
Figure 9C:
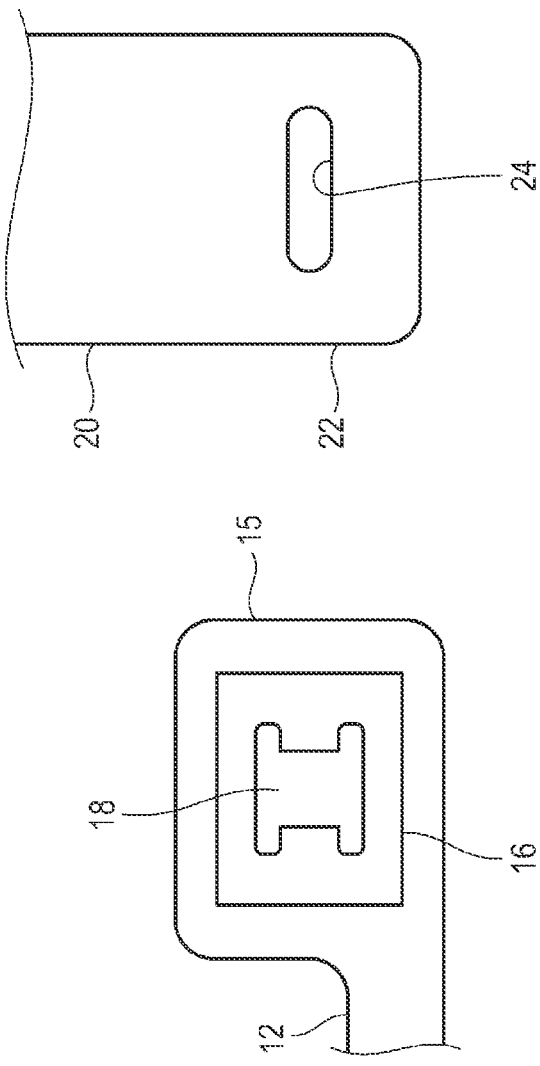
FIG. 9C is a partially-enlarged plan view of the voltage monitoring module according to the third embodiment.
Figure 9D:
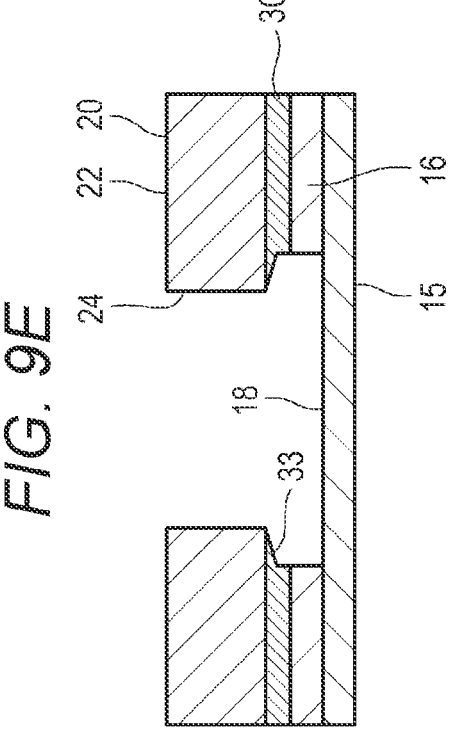
FIG. 9D is a cut end view along an A-A line of FIG. 9C.

Note that FIG. 8 shows, in closeup, an area including a single metal plate 20 and an end portion 15 of a single extending portion 12 corresponding to the metal plate 20. FIG. 9A shows an area including the single end portion 15 in closeup. FIG. 9B shows an area including a single protruding portion 22 in closeup. FIGS. 9A and 9C do not show a wiring 17.

A voltage monitoring module 100 according to the present embodiment is different from the voltage monitoring module 100 according to the first embodiment on the following points. On other points, the voltage monitoring module 100 according to the present embodiment has a configuration similar to that of the voltage monitoring module 100 according to the first embodiment.

As shown in FIGS. 8 and 9C, in the case of the present embodiment, when viewed in a thickness direction of the metal plate 20, part of a non-formation area 18 protrudes from a through-hole 24.

Such a structure is effective in, e.g., a case where there are limitations on the size of the through-hole 24. As an example of such a case, there is a case where due to a small area (e.g., the area of the protruding portion 22) of the metal plate 20, it is difficult to form, without deforming the metal plate 20, the through-hole 24 having such a size that the through-hole 24 includes the non-formation area 18. Moreover, this structure is also effective in a case where there are limitations on the specifications or design of the voltage monitoring module.

More specifically, in the case of the present embodiment, in a first direction (a right-left direction in FIGS. 9A to 9C) of directions along a plate surface of the metal plate 20, the non-formation area 18 has a smaller dimension than that of the through-hole 24. On the other hand, in a section direction (an up-down direction in FIGS. 9A to 9C) perpendicular to the first direction, the through-hole 24 has a smaller dimension than that of the non-formation area 18.

For example, as shown in FIG. 9C, the non-formation area 18 is arranged at a center portion of the through-hole 24 in the first direction. In addition, in the second direction, the through-hole 24 is arranged at a center portion of the non-formation area 18. In other words, the non-formation area 18 protrudes from the through-hole 24 in one and opposite directions in the second direction.

Thus, a fillet 31 is divided in two in an area viewable through the through-hole 24. That is, in FIGS. 9C and 9D, the fillet 31 positioned on the left side of the non-formation area 18 and the fillet 31 positioned on the right side of the non-formation area 18 are present.

In a case where the fillet 31 divided in two (divided in two in the first direction) with respect to the non-formation area 18 is formed as in the present embodiment, if the position of the metal plate 20 shifts from the land 16 in the first direction as shown in FIG. 10A, the fillet 31 with a sufficient size is formed on one side (e.g., the right side in FIGS. 10A and 10B) of the non-formation area 18. Thus, such a fillet 31 can be reliably recognized by inspection.

In the case of the present embodiment, the through-hole 24 is formed in an oval shape elongated in the first direction as shown in, e.g., FIG. 9B.

On the other hand, as shown in FIG. 9A, the non-formation area 18 is formed in such a shape that an H-shape lies down, for example.

In this case, each fillet 31 has, for example, a half-moon shape if the amount of solder 30 is sufficiently great. On the other hand, each fillet 31 has, for example, a half-arc shape if the amount of solder 30 is small.

In the case of the present embodiment, the effect of reducing relative position shift between the land 16 and the metal plate 20 in the second direction (the direction of an arrow C shown in FIG. 9C) is obtained.

Figure 9E:
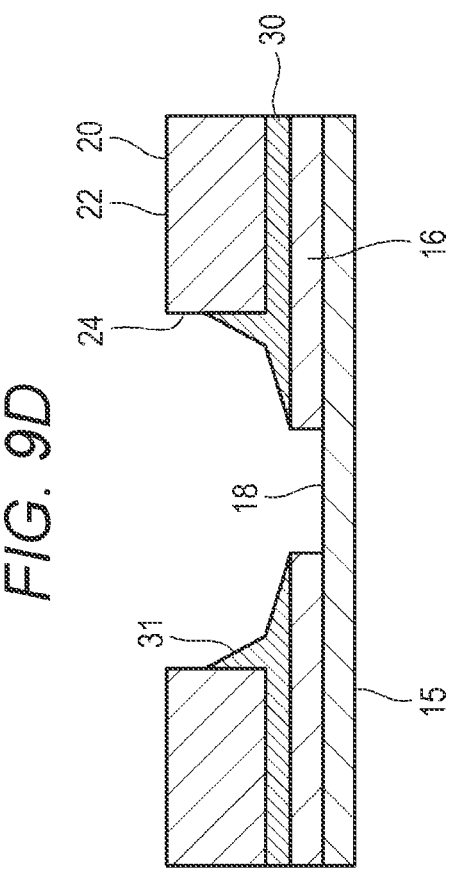
FIG. 9E is a cut end view along a B-B line of FIG. 9C.

In the case of the present embodiment, a fillet 33 is, as shown in, e.g., FIG. 9E, formed along the through-hole 24 at a location facing the non-formation area 18 on a surface of the protruding portion 22 facing an end portion 15 side. The fillet 33 has a shape inverted from that of the fillet 31.

Fourth Embodiment

Next, a fourth embodiment will be described with reference to FIGS. 11 to 12D.

Figure 11:
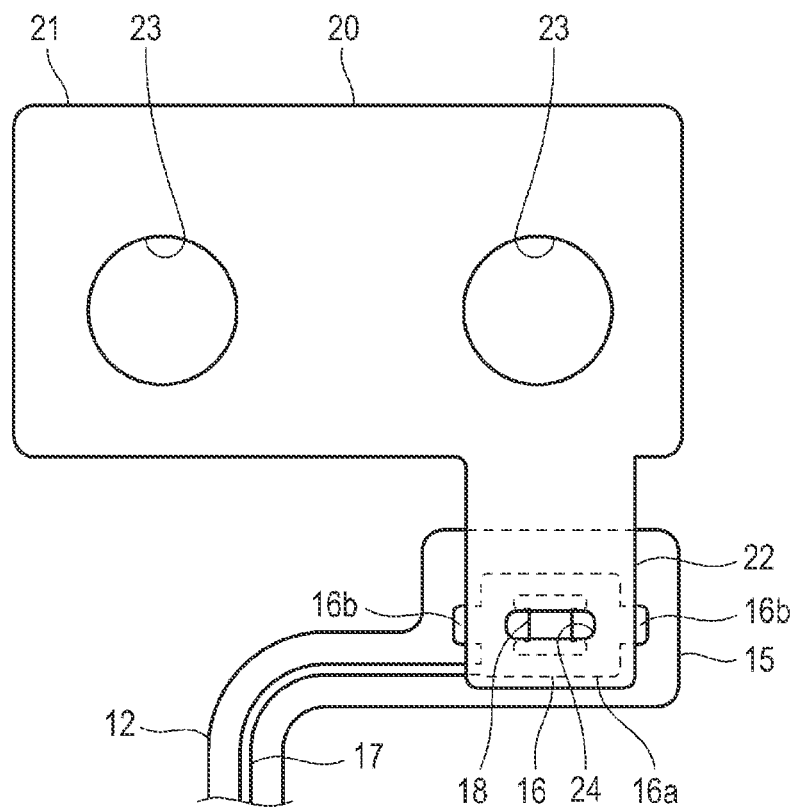
FIG. 11 is a partially-enlarged plan view of a voltage monitoring module according to a fourth embodiment.

Note that FIG. 11 shows, in closeup, an area including a single metal plate 20 and an end portion 15 of a single extending portion 12 corresponding to the metal plate 20. FIG. 12A shows an area including the single end portion 15 in closeup. FIG. 12B shows an area including a single protruding portion 22 in closeup. FIGS. 12A and 12C do not show a wiring 17.

A voltage monitoring module 100 according to the present embodiment is different from the voltage monitoring module 100 according to the third embodiment on the following points. On other points, the voltage monitoring module 100 according to the present embodiment has a configuration similar to that of the voltage monitoring module 100 according to the third embodiment.

In the case of the present embodiment, as shown in FIG. 11 and 12C, when viewed in a thickness direction of the metal plate 20, part of a land 16 protrudes from the outline of the metal plate 20.

Thus, a fillet 34 (FIGS. 12C and 12D) is also formed on a portion (later-described protruding pieces 16b) of the land 16 protruding from the metal plate 20. Consequently, the fillet (a fillet 31 or the fillet 34) can be easily reliably inspected.

The shape of the land 16 is not specifically limited. As the example of the present embodiment, the land 16 is formed in a shape having a rectangular main portion 16a and a pair of right and left protruding pieces 16b protruding from the main portion 16a. Note that a non-formation area 18 is formed at the main portion 16a. In the case of the present embodiment, the shape of the non-formation area 18 is similar to that of the third embodiment. In the case of the present embodiment, the effect of reducing relative position shift between the land 16 and the metal plate 20 in a second direction (an up-down direction in FIG. 12C) is also obtained.

As shown in FIG. 12C, the left protruding piece 16b protrudes leftward of the outline of (the protruding portion 22 of) the metal plate 20. Similarly, the right protruding piece 16b protrudes rightward of the outline of (the protruding portion 22 of) the metal plate 20. The fillet 34 is formed on each protruding piece 16b.

Note that as shown in FIG. 12D, the fillet 34 is formed to the edge of the land 16, for example.

Fifth Embodiment

Next, a fifth embodiment will be described with reference to FIG. 13.

A voltage monitoring module 100 according to the present embodiment is different from the voltage monitoring module 100 according to the first embodiment on the following points. On other points, the voltage monitoring module 100 according to the present embodiment has a configuration similar to that of the voltage monitoring module 100 according to the first embodiment.

In the case of the present embodiment, a flexible printed circuit board 10 has no extending portions 12. A wiring 17 and a land 16 are arranged at a location equivalent to the body portion 11 of the first embodiment.

In the case of the present embodiment, a metal plate 20 is a metal tab connected to a bus bar 50. The bus bar 50 is welded to the metal plate 20.

Although not shown in FIG. 13, the voltage monitoring module 100 includes the multiple metal plates 20 and the multiple bus bars 50. These multiple bus bars 50 connect multiple battery cells 70 in series.

Each embodiment has been described above with reference to the drawings. These embodiments are examples of the present embodiments. In the present embodiments, various configurations other than those described above can be also employed.

The above-described embodiments can be combined as necessary without departing from the gist of the present embodiments. For example, in a case where the through-hole 24 or the non-formation area 18 has the shape of the first embodiment, the third embodiment, or the fourth embodiment, the multiple through-holes 24 may be formed at the single metal plate 20, and the multiple non-formation areas 18 may be present on the single land 16.

The present embodiments include the following technical ideas.

(1) A voltage monitoring module including a flexible printed circuit board having multiple wirings and multiple lands each of which is connected to one end of the wiring and multiple metal plates arranged on the lands and soldered to the lands, a through-hole being partially formed at a location of the metal plate corresponding to the land and a non-formation area with no conductor being formed at a location of the land corresponding to part of the through-hole.

(2) The voltage monitoring module according to (1), in which when viewed in a thickness direction of the metal plate, the land is within the outline of the metal plate.

(3) The voltage monitoring module according to (1), in which when viewed in a thickness direction of the metal plate, part of the land protrudes from the outline of the metal plate.

(4) The voltage monitoring module according to any one of (1) to (3), in which when viewed in the thickness direction of the metal plate, the non-formation area is within the through-hole.

(5) The voltage monitoring module according to any one of (1) to (3), in which when viewed in the thickness direction of the metal plate, part of the non-formation area protrudes from the through-hole.

(6) The voltage monitoring module according to any one of (1) to (5), in which at least one of the through-hole or the non-formation area is in a non-circular shape.

(7) The voltage monitoring module according to any one of (1) to (6), in which the through-hole includes multiple through-holes formed at the single metal plate and the non-formation area includes multiple non-formation areas present on the single land.

(8) The voltage monitoring module according to any one of (1) to (7), in which the metal plate is a bus bar connecting multiple battery cells in series.

(9) The voltage monitoring module according to any one of (1) to (7), in which the metal plate is a metal tab connected to a bus bar.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A voltage monitoring module comprising:
   a land; and
   a metal plate arranged on the land and soldered to the land,
   wherein
   the land is formed at an end portion of a wiring,
   a through-hole is partially formed at a location of the metal plate corresponding to the land,
   a non-formation area is formed at a location of the land corresponding to part of the through-hole, and
   no conductor is formed in at least a part of the non-formation area when viewed in a thickness direction of the metal plate.

2. The voltage monitoring module according to claim 1, wherein
   when viewed in the thickness direction of the metal plate, the land is within an outline of the metal plate.

3. The voltage monitoring module according to claim 1, wherein
   when viewed in the thickness direction of the metal plate, part of the land protrudes from an outline of the metal plate.

4. The voltage monitoring module according to claim 1, wherein
   when viewed in the thickness direction of the metal plate, the non-formation area is within the through-hole.

5. The voltage monitoring module according to claim 1, wherein
   when viewed in the thickness direction of the metal plate, part of the non- formation area protrudes from the through-hole.

6. The voltage monitoring module according to claim 1, wherein
   at least one of the through-hole or the non-formation area is in a non-circular shape.

7. The voltage monitoring module according to claim 1, wherein
   the through-hole includes multiple through-holes formed at the metal plate, and the non-formation area includes multiple non-formation areas present on the land.

8. The voltage monitoring module according to claim 1, wherein
   the metal plate is a bus bar connecting multiple battery cells in series.

9. The voltage monitoring module according to claim 1, wherein
   the metal plate is a metal tab connected to a bus bar.

* * * * *